United States Patent [19]
Shimizu et al.

[11] Patent Number: 4,741,787
[45] Date of Patent: May 3, 1988

[54] METHOD AND APPARATUS FOR PACKAGING SEMICONDUCTOR DEVICE AND THE LIKE

[75] Inventors: Katsuo Shimizu; Saburó Narisawa, both of Saitama, Japan

[73] Assignee: Seiei Kohsan Co., Ltd., Saitama, Japan

[21] Appl. No.: 833,866

[22] Filed: Feb. 27, 1986

[30] Foreign Application Priority Data

Aug. 28, 1985 [JP] Japan .................. 60-188852

[51] Int. Cl.$^4$ ............................................ B29C 43/18
[52] U.S. Cl. ..................................... 156/64; 156/228; 156/245; 156/292; 156/303.1; 156/307.3; 156/378; 156/382; 156/499; 156/500; 29/569.1; 264/272.17
[58] Field of Search .................. 156/64, 245, 228, 292, 156/298, 303.1, 307.3, 322, 378, 499, 500, 382; 264/272.17; 425/116, 121, 125, 411, 544; 29/588

[56] References Cited
U.S. PATENT DOCUMENTS
4,480,975 11/1984 Plummer et al. ............... 264/272.17

FOREIGN PATENT DOCUMENTS
0080947 5/1984 Japan ..................................... 29/588
0172241 9/1984 Japan .............................. 264/272.17
0202653 11/1984 Japan ...................................... 29/588
0149156 8/1985 Japan ...................................... 29/588
0224234 11/1985 Japan ...................................... 29/588
0002348 1/1986 Japan ...................................... 29/588

Primary Examiner—Caleb Weston
Attorney, Agent, or Firm—Browdy & Neimark

[57] ABSTRACT

The present invention relates to a method of and an apparatus for packaging a semiconductor device and the like to package the semiconductor device and the like completely associated with resin.

A process for packaging a semiconductor device and the like according to the present invention comprises the steps of providing a tablet of thermoplastic resin such as epoxy resin, weighing the tablet for upper and lower packages, preheating the upper and lower packages, then compression molding the packages in a package shape, coating the opposed surfaces to be bonded of the upper and lower packages with a fusible bonding agent such as thermoplastic resin and/or bonding agent, then interposing a chip of a semiconductor device and the like between the upper package and the lower package, heating the upper and lower packages while supplying nitrogen gas in a vacuum molding machine, bonding the upper and lower packages, and conducting an antioxidation of a metal portion.

9 Claims, 19 Drawing Sheets

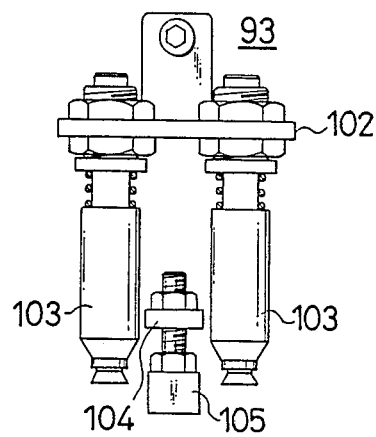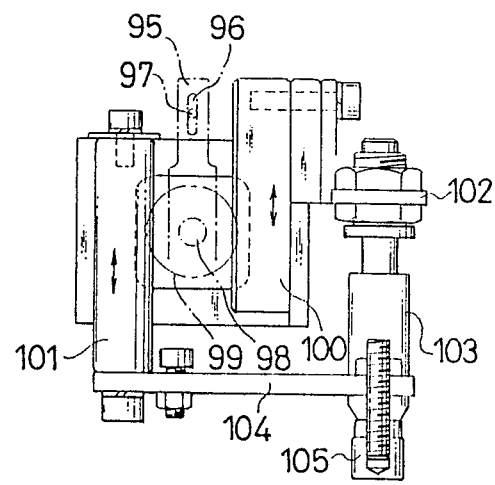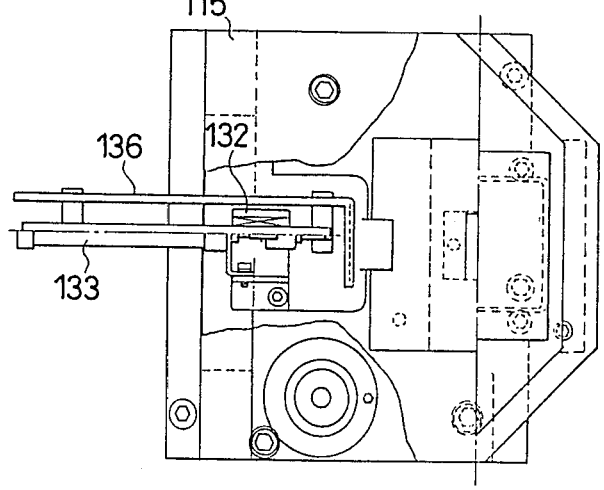

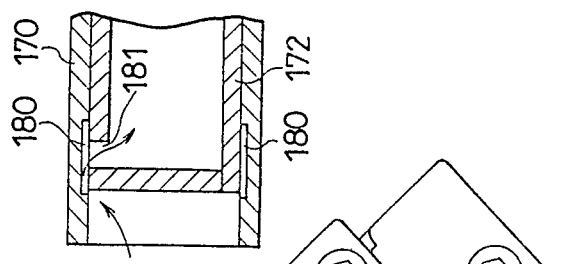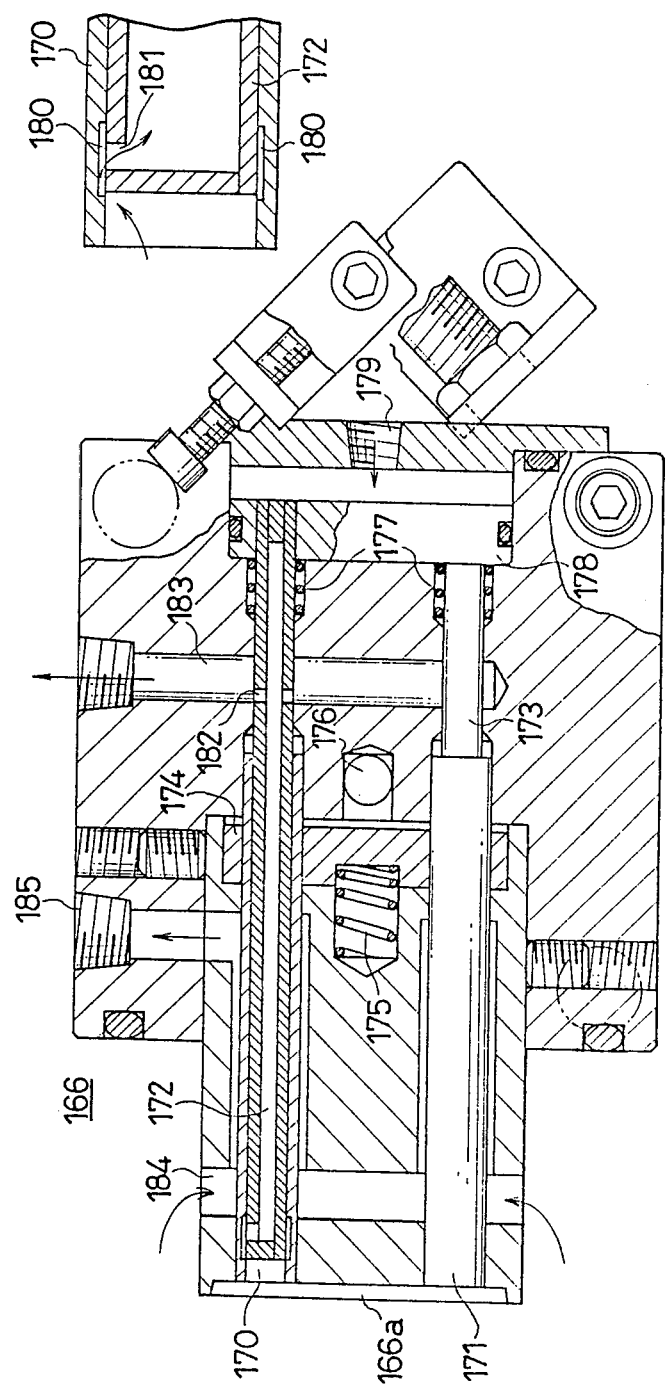

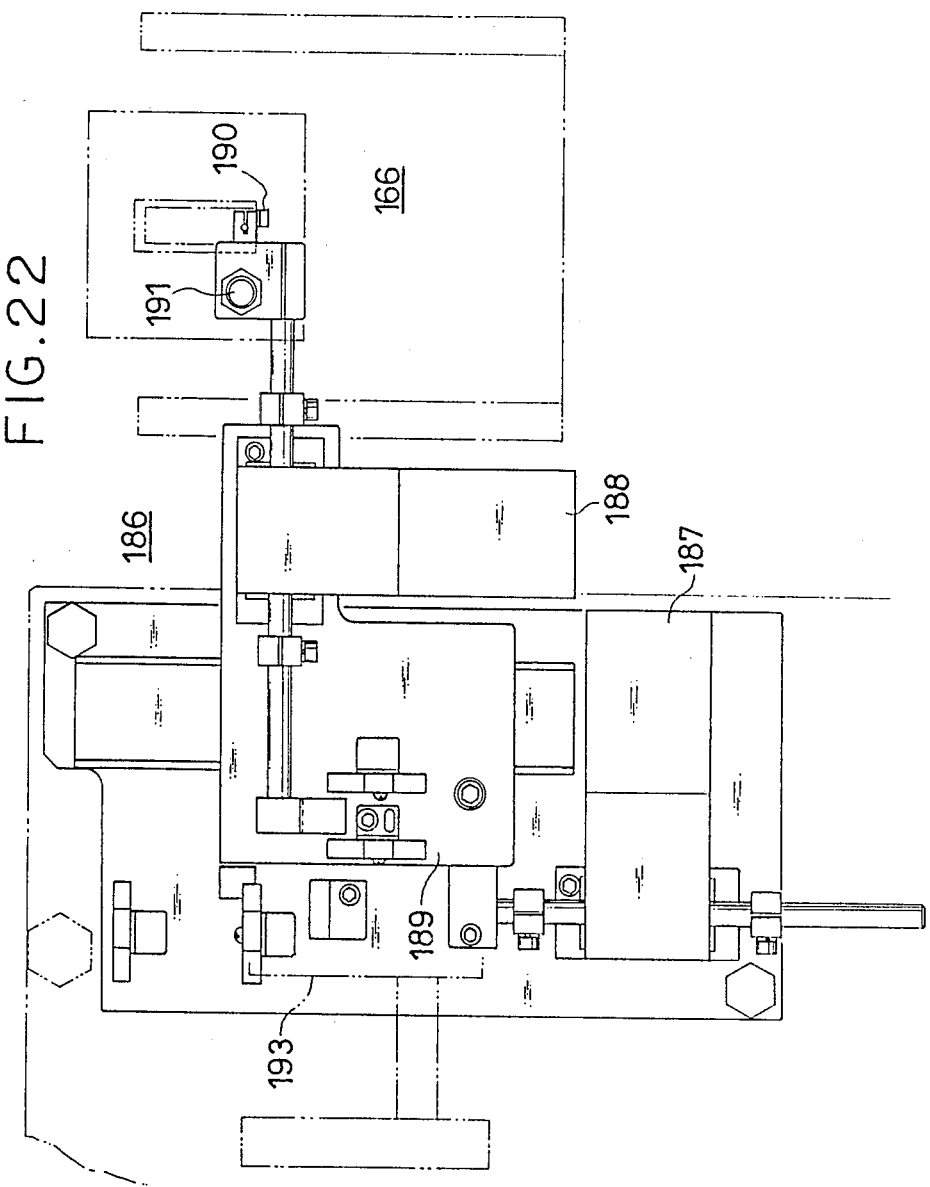

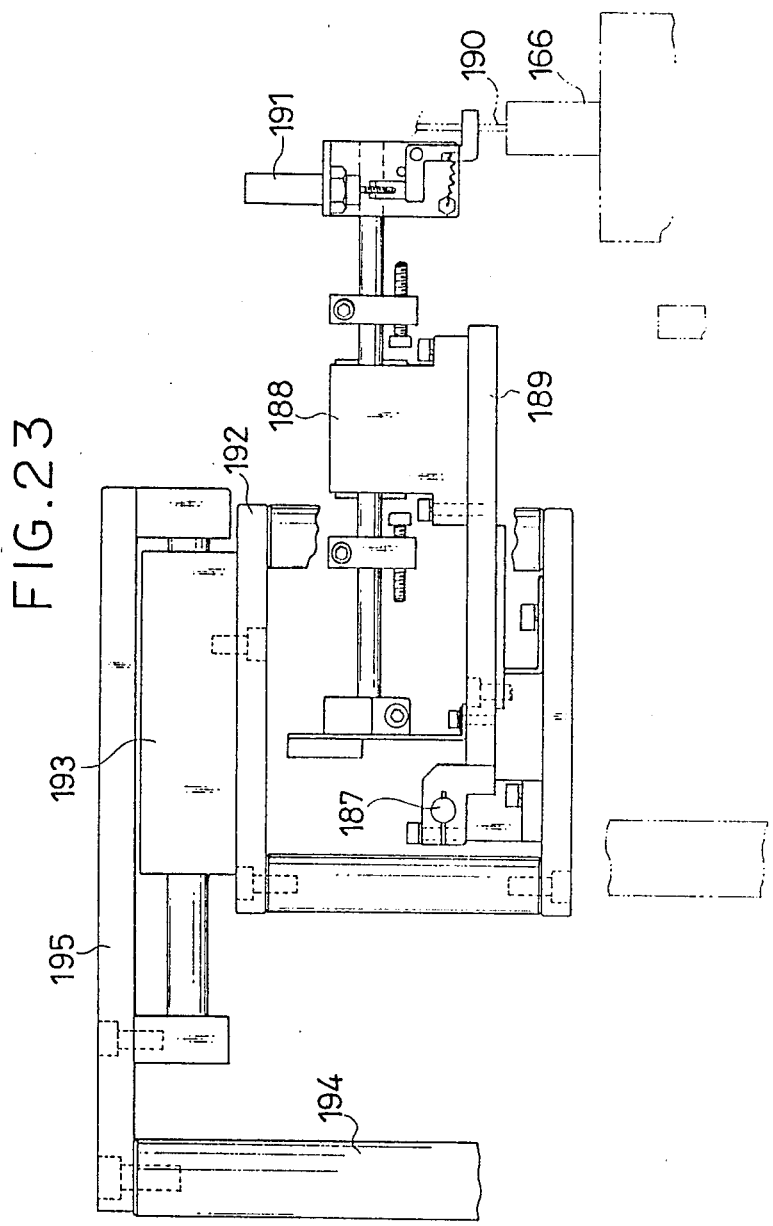

METHOD AND APPARATUS FOR PACKAGING SEMICONDUCTOR DEVICE AND THE LIKE

FIELD OF THE INVENTION

The present invention relates to a method of and an apparatus for packaging a semiconductor device and the like to package the semiconductor device and the like completely associated with resin.

BACKGROUND OF THE INVENTION

A molding process which is called "a transfer molding process" for press-fitting resin plasticized in a pot through a runner into the cavity of a mold under high pressure at high temperature has been employed in general to package a semiconductor device and the like. This process must firmly retain a terminal of the semiconductor device which is extended outside in the mold so as not to externally lead the resin. Since the resin is press-fitted into the mold under very high pressure such as several tens tons, the mold of very high accuracy is required. In addition, in order to mold with reasonable expenses, a large number of semiconductor devices must be simultaneously molded, resulting in a large scale of mold of high cost. Therefore, this process is not appropriate except for a small type and large quantity production. However, the types of semiconductor devices to be used for a limited utility have been recently increased, and trial production necessitates only small quantity. To this end, it is improper to employ the abovementioned transfer molding process. Thus, a simple packaging method for semiconductor devices for a multiple kind and small quantity production instead of the prior process has been desired.

A process for sealing a chip by preparing a pair of packages of complete product which is eventually molded in advance and interposing and sealing the chip bonded on a lead frame between the pair of packages has been proposed to respond to this requirement.

According to this proposed process, a large-scale mold is not necessary, but since the packages used in this process is made of thermoplastic resin, a difficulty arises in bonding between the packages, thereby causing the chips not to be completely sealed and hardly preventing the dies used from oxidizing. Therefore, a novel packaging method and apparatus has been required so as to solve these drawbacks in this process.

SUMMARY OF THE INVENTION

Accordingly, an object of the present invention is to provide a method and a apparatus for simply packaging semiconductor devices and the like adapted for a large type and small quantity production.

Another object of the present invention is to provide a method and an apparatus for packaging semiconductor devices and the like capable of packaging the semiconductor devices and the like inexpensively without a large-scale and expensive mold.

Still another object of the invention is to provide a method and an apparatus for packaging semiconductor devices and the like which can completely bond a pair of packages, reliably seal chips and prevent the chip from dew-condensing and oxidizing by employing thermoplastic resin for the package.

Other and further objects, features and advantages will appear more fully from the following description.

BRIEF DESCRIPTION OF THE DRAWINGS

FIGS. 13 and 14 are views showing the construction of a vacuum conduit;

FIG. 15 is a plan view of a preheater;

FIGS. 19 and 20 are views showing the construction of an ejector conduit and a vacuum conduit in a molding head;

FIG. 22 is a plan view of a dispenser; and

FIG. 23 is a side view of the dispenser.

DETAILED DESCRIPTION OF THE PREFERRED EMBODIMENTS

A process for packaging a semiconductor device and the like according to the present invention comprises the steps of providing a tablet of curable, i.e. thermosetting resin such as epoxy resin, weighing the tablet for upper and lower packages, preheating the upper and lower packages, then compression molding the packages in a package shape, coating the opposed surfaces to be bonded of the upper and lower packages with a fusible bonding agent such as thermoplastic resin and/or bonding agent, then interposing a chip of a semiconductor device and the like between the upper package and the lower package, heating the upper and lower packages while supplying nitrogen gas in a vacuum molding machine, bonding the upper and lower packages, and conducting an antioxidation of a metal portion.

Figure 1:
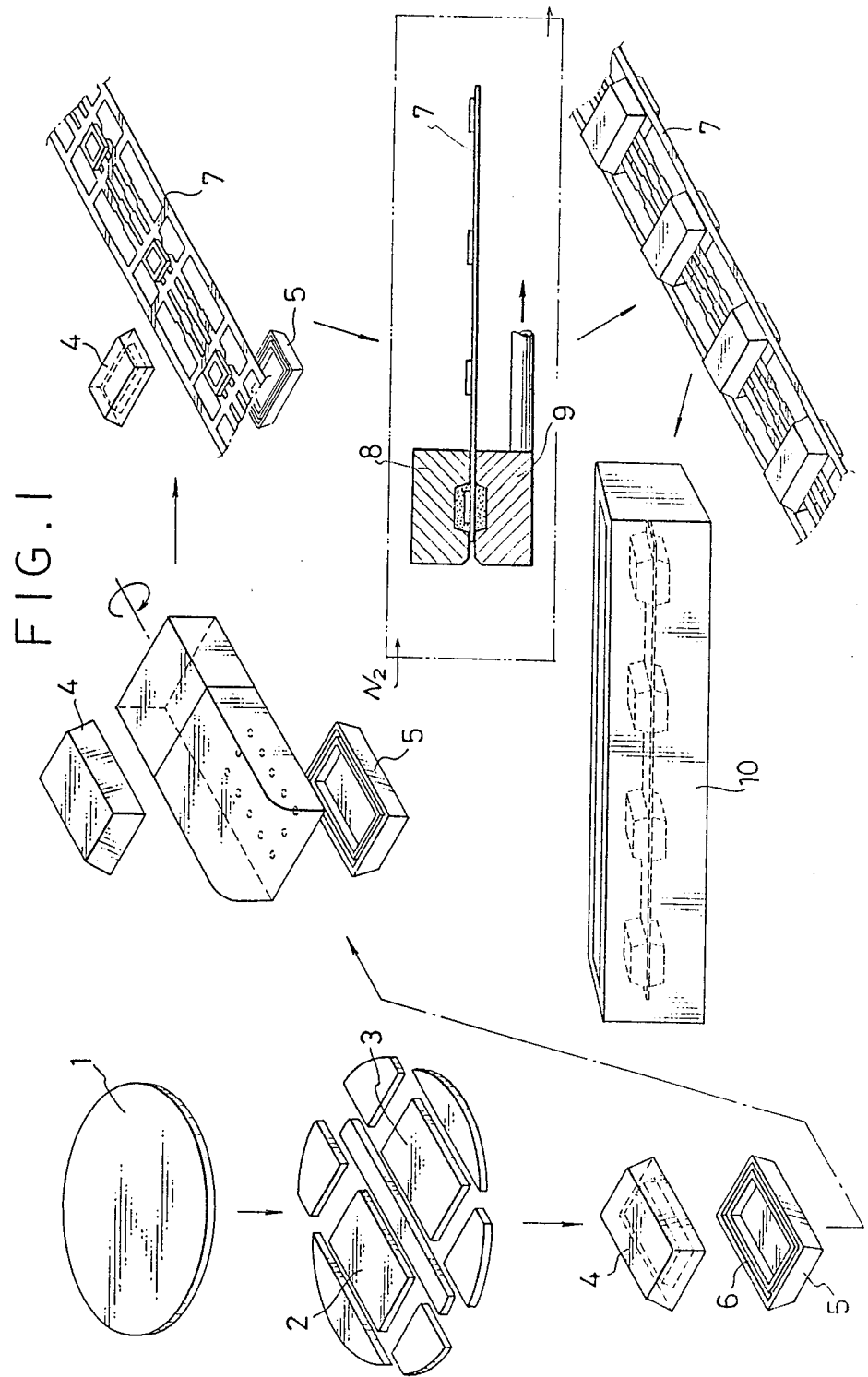
FIG. 1 is a view showing the working steps according to a method of packaging semiconductor devices and the like according to the present invention.

The method of the invention will now be described in detail with reference to FIG. 1. A tablet 1 is first produced by compression molding curable resin such as epoxy resin. The tablet 1 may be square or rectangular, or circular in shape. The tablet 1 ordinarily has a thickness of approx. 2 to 3 mm in size preferably to produce a set of upper and lower shell equivalents from one sheet of the tablet 1. The tablet 1 is then weighed (set in the volume) for upper and lower package equivalents while preheating the tablet 1 at approx. 70° to 80° C. More specifically, in order to attain the predetermined volume for the upper and lower packages, blanks of a predetermined size may be punched by pressing from the tablet 1 (in blanking). Blanks 2 and 3 for the upper package and the lower package thus obtained are then preheated by means of a high frequency preheater or the like, and molded in package shape by a compression molding process. In this state, the packages are in an incomplete state, i.e., semicured state. It is preferable to form a groove 6 for coating a fusion bonding agent on one or both of the opposed surfaces to be bonded of the upper package 4 and the lower package 5 in case of molding. In case that the groove 6 is formed on the opposed surfaces of the packages 4 and 5, a fusion bonding agent such as a thermoplastic resin and/or a bonding agent is coated in the groove 6. Then, a chip of a semiconductor device finished in assembling on a lead frame 7 is interposed between a set of the packages 4 and 5 thus coated with the fusible bonding agent from above and below or from right side and left side, and molded. This molding is conducted while heating in a vacuum molding machine. More specifically, the packages 4 and 5 are interposed between molds 8 and 9, heated at approx. 150° C. to be cured to set the packages 4 and 5 in a stable state, and simultaneously completely bonded integrally through a fusible bonding agent. The packaging bonding work may be simultaneously performed for all of a number of (ordinarily 5 or 6 pieces) packages on one sheet of the lead frame 7. The molds 8 and 9 are evacuated in vacuum while charging nitrogen gas during the work so as to prevent the metal portion from oxidizing. Preferably, not only the molds but also the entire molding machine are placed in the nitrogen atmosphere. Subsequently, annealing step, i.e., an operation for removing distortions occurred in the packages 4 and 5 by heating and cooling is executed. For example, the molded products are heated in an oven 10 for 4 to 5 hours.

Figure 2:
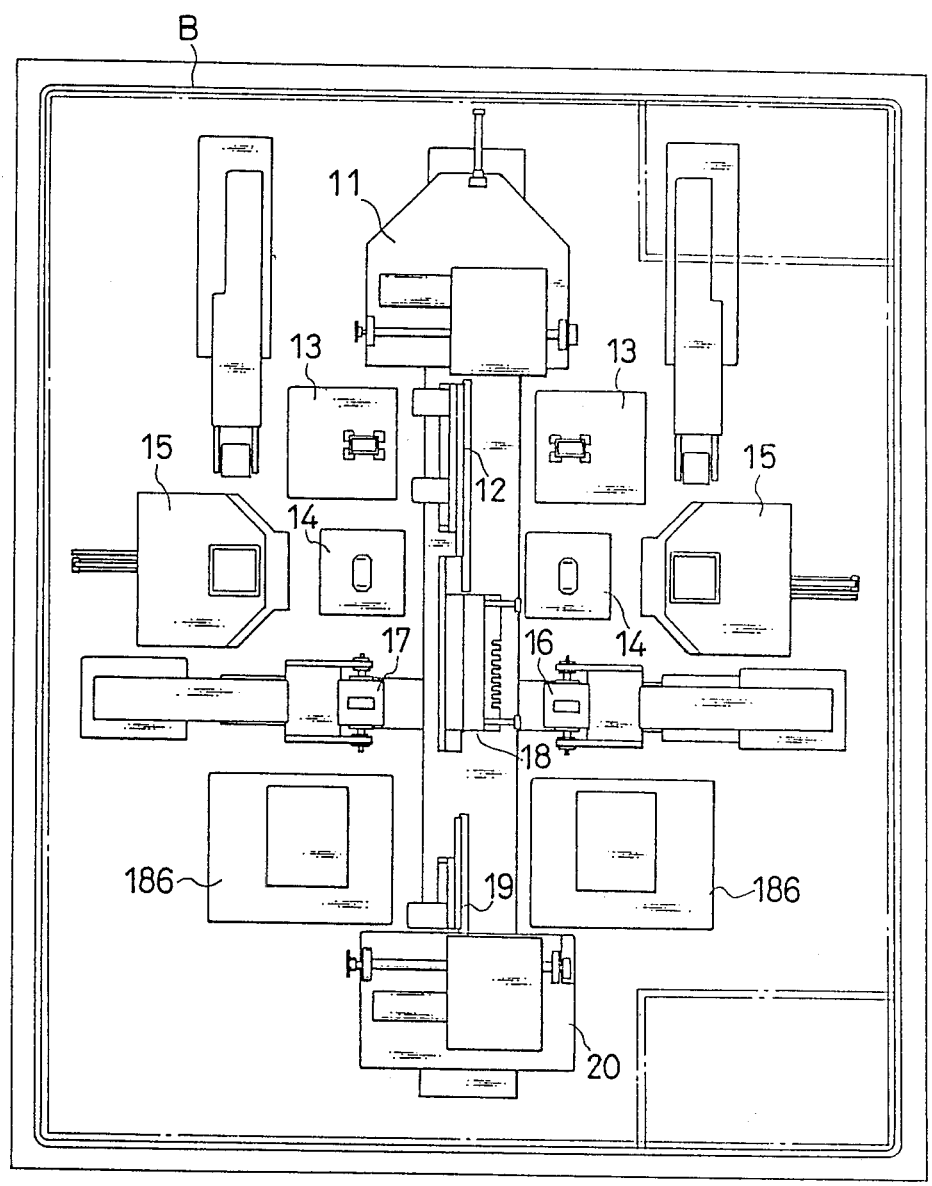
FIG. 2 is a view showing a layout of the entire apparatus for packaging semiconductor devices and the like according to the present invention.
Figure 3:
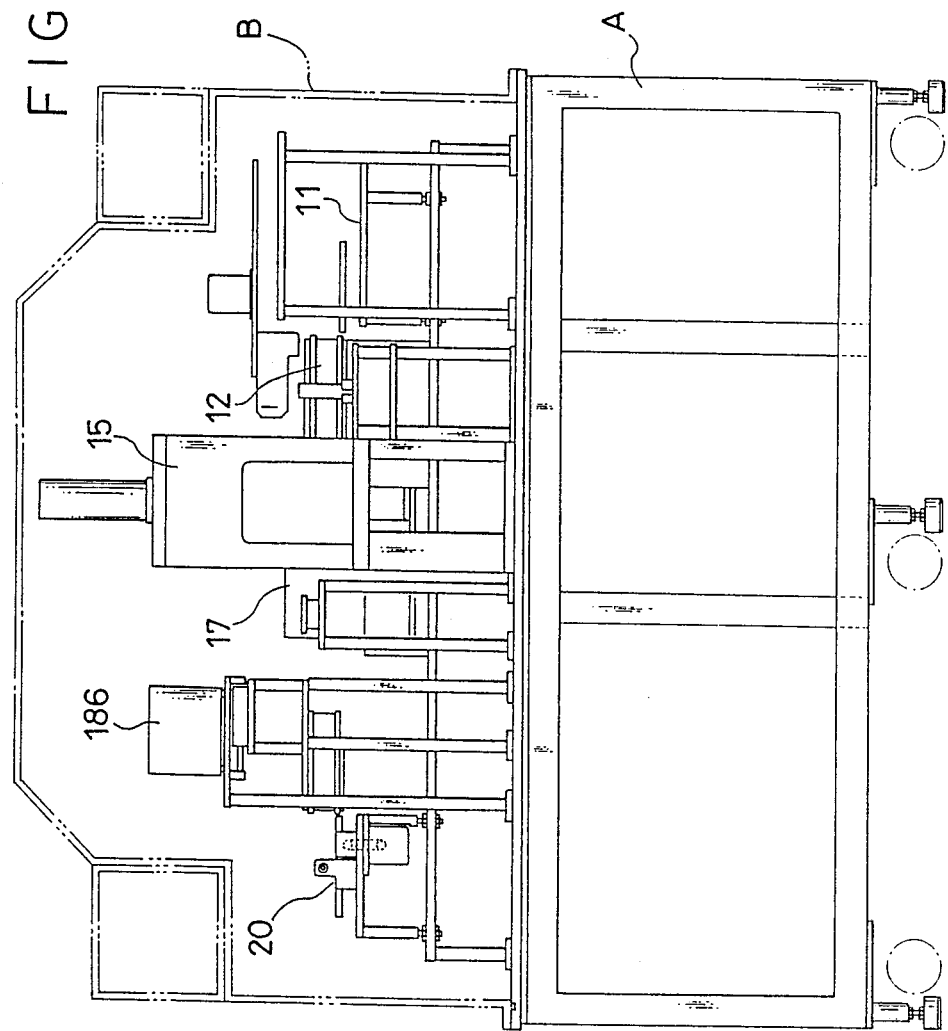
FIG. 3 is a side view of the apparatus.

An apparatus for packaging a semiconductor device and the like of the presen invention carries out the abovementioned method. The apparatus comprises a lead frame supplying unit for pushing out lead frames aligned longitudinally and contained in a magazine one by one into a loader, a loader for conveying the lead frame into a molding unit, a molding unit connected with the loader and having a molding head for attracting the supplied tablet, turning the tablet at 90° oppositely, and approaching from both sides of the lead frame to package the tablet, a pair of right and left tablet containing unit for laminating, containing a number of tablets of curable resin in the amount corresponding to one molding, lifting and supplying the tablets, a tablet supplying unit for attracting the tablet from the tablet containing unit and supplying the tablet to the molding head of the molding unit, and an unloader for recovering the packaged lead frame into the magazine. The drawings show an embodiment of the apparatus according to the present invention. FIG. 2 is a plan view showing the example of the construction of the entire apparatus associated with a preheating unit., and FIG. 3 is a side view of the apparatus. There are shown a lead frame supplying unit 11, a loader 12, a tablet supplying unit 13, a tablet conveying unit 14, a preheating unit 15, molding head 16, 17, a holding unit 18, an unloader 19 and a lead frame containing unit 20. The apparatus of the invention is installed on a trestle A, and placed in nitrogen atmosphere sealed by a cover B for coating the trestle A (FIG. 3). The constructions of the units of the apparatus of the invention will be described in detail.

Figure 4:
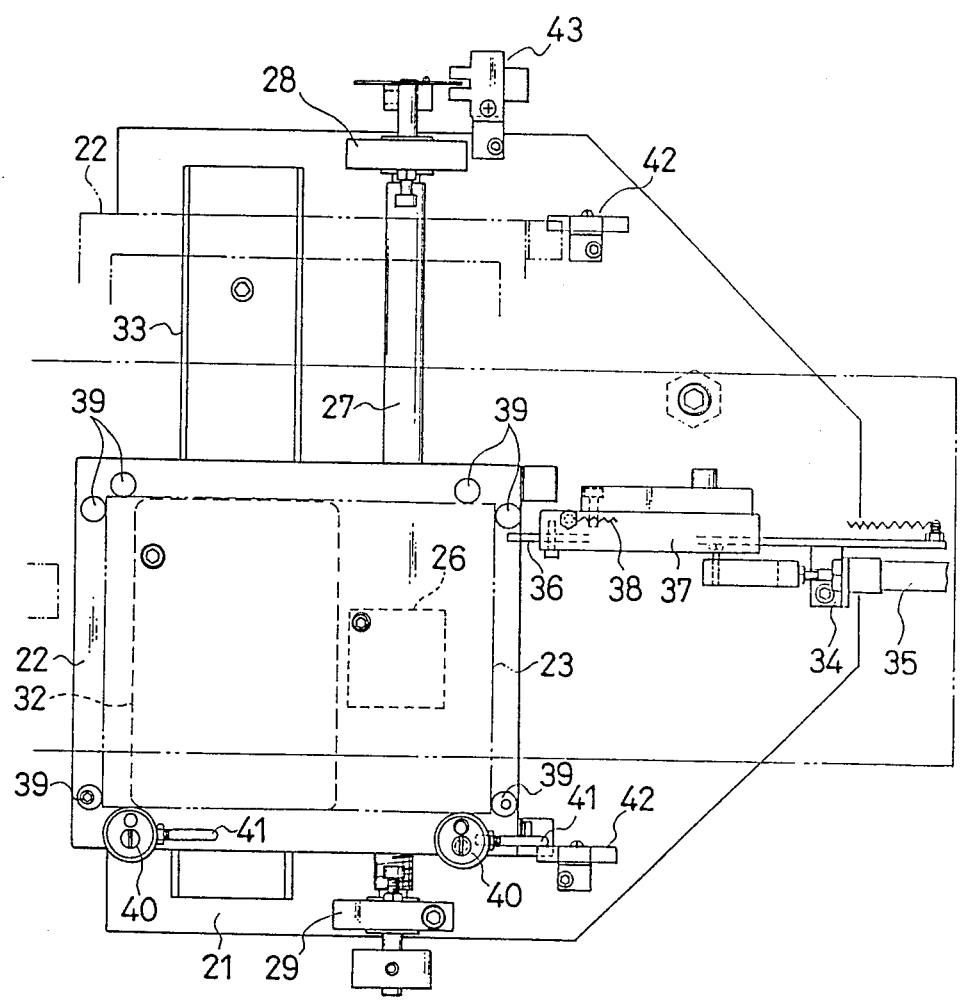
FIG. 4 is a plan view of a lead frame supplying unit.
Figure 5:
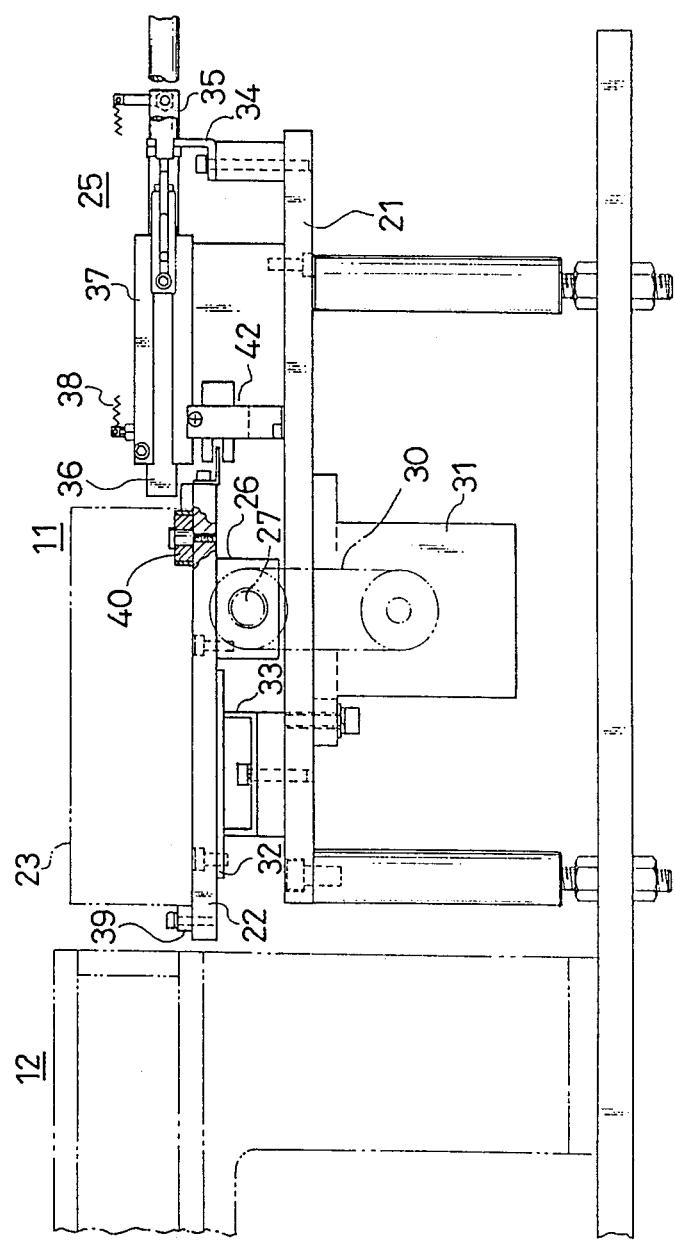
FIG. 5 is a side view of the supplying unit.

The construction of the lead frame supplying unit 11 is shown in FIGS. 4 and 5. The lead frame supplying unit 11 includes a movable base 22 placed on a base plate 21, and a pusher mechanism 25 for pushing the lead frame in a magazine 23. A female threaded block 26 is secured to the back surface side of the base 22, and a threaded shaft 27 is engaged with the block 26. The shaft 27 is supported at both ends via bearings 28 and 29 onto the plate 21, and rotatably driven by an electric motor 31 fixedly secured to the back surface side of the plate 21 through a chain 30. A slide plate 32 is fixedly secured to the back surface side of the base 22 to slide on a rail laid on the plate 21. The pusher mechanism 25 is mounted on the plate 21. More particularly, a cylinder 35 is fixedly secured through a bracket 34, and a pusher 36 is mounted at the cylinder rod. The pusher 36 is moved backward by the cylinder 35. The movable pusher 36 is supported by a guide rail 37 of C-shaped cross section stool on the plate 21. A spring 38 is extended to move forward the pusher 36 between the rear end of the pusher 36 and the guide rail 37. A lock roller 39 and a roller 40 are mounted on the base 22 for positioning the magazine 23. The roller 40 is eccentrically journaled to push the maga ine by rotating a pin handle 41. A sensor 42 for detecting the movement of the base 22 and a sensor 43 for detecting the rotation of the shaft 27 are further mounted on the plate 21.

Figure 6:
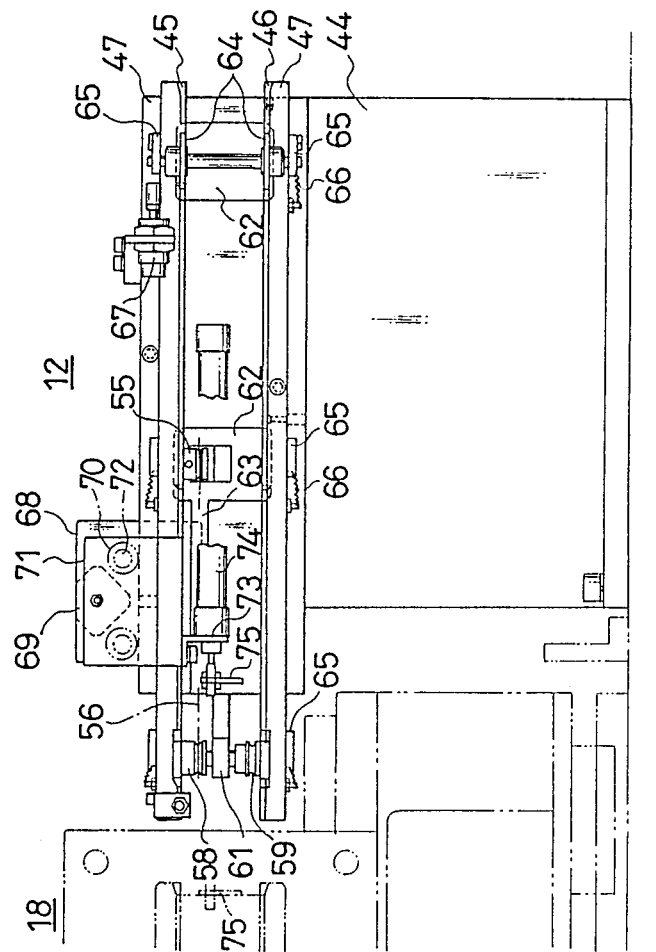
FIG. 6 is a front view of a loader.
Figures 7, 8:
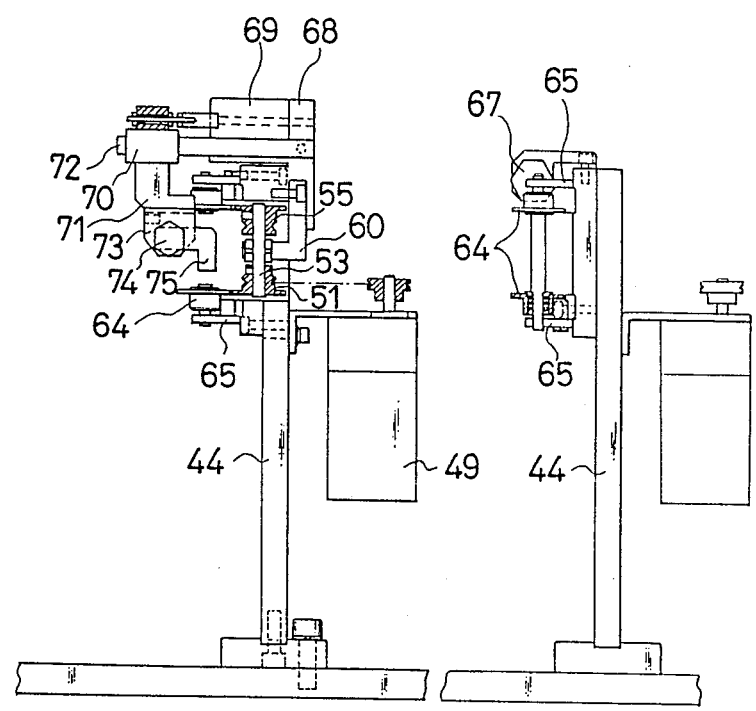
FIGS. 7 and 8 are side longitudinal sectional views of the loader.
Figure 9:
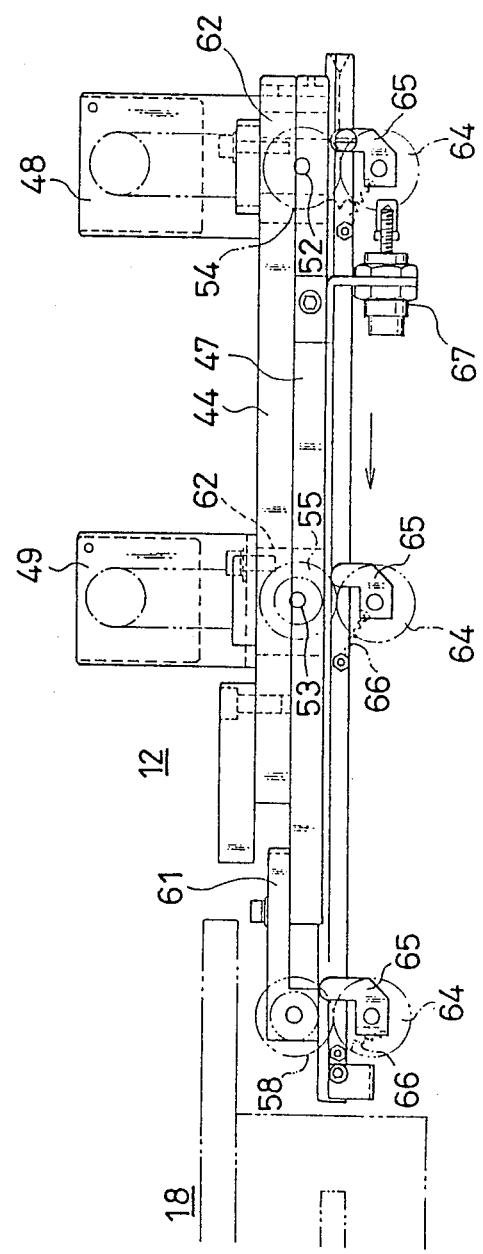
FIG. 9 is a plan view of the loader.

Referring now to FIGS. 6 through 9, the construction of the loader 12 will now be described. A lead frame guide 47 having slots 45 and 46 to be engaged with the upper and lower edges of the lead frame is mounted above a vertical plate 44. Electric motors 48 and 49 are fixedly secured to the two positions on the back surface side of the plate 44 to rotatably drive pulleys 50 and 51, respectively. (FIG. 7 does not show pulley 50.) The rotations of the pulleys 50 and 51 are respectively transmitted through shafts 52 and 53 to pulleys 54 and 55 of upside, and the rotation of the pulley 55 is further transmitted through a belt 56 to pulleys 58 and 59. (FIG. 6) The shafts 52 and 53 are rotatably supported by a shaft holder 60 of L shape mounted on the plate 44. (FIG. 7). The shafts of the pulleys 58 and 59 are rotatably supported by a shaft holder 61 which extends laterally from the plate 44. (FIGS. 6 and 9). Windows 62 are respectively formed at the mounts of the pulleys 50, 51, 54 and 55 of the plate 44, and the pulleys 50, 51, 54 and 55 are respectively contained in the mounts. (FIG. 6). A lateral opening 63 is formed laterally from the window 62, and a belt 56 for coupling the pulleys 55 and 58 is disposed therein. Driven rollers 64 freely rotated in contact with the pulleys 50, 51, 54 and 55 are provided at the pulleys 50, 51, 54 and 55, respectively. The rollers 64 are supported by a rotary plate 65 rotatably mounted on the guide 47, and pulled at one end always by a spring 66 secured to the guide 47 in pressure contact with the opposed pulley. (FIG. 9) The rollers of the driven rollers 64, contacted under pressure with the pulleys 50 and 54 ar separated from the pulleys 50 and 54 by pressing by a cylinder 67 mounted at the guide 47 of upside. In other words, when the plate 65 is pressed by the cylinder 67, the plate 65 rotates, the roller 65 supported thereto is accordingly rotated and separated from the pulleys 50 and 54, respectively. A cylinder base 68 is provided at the upper end of the plate 44, and a cylinder 69 is secured thereto. The cylinder rod of the cylinder 69 is fixedly secured to an LM plate 71 having LM balls 70 at the right and left sides. A guide shaft 72 secured at one end thereof to the base 68 is slidably inserted into the balls 70. A cylinder 74 is mounted through a bracket 73 below the plate 71, and a pusher plate 75 is mounted at the cylinder rod of the cylinder 74.

Figure 10:
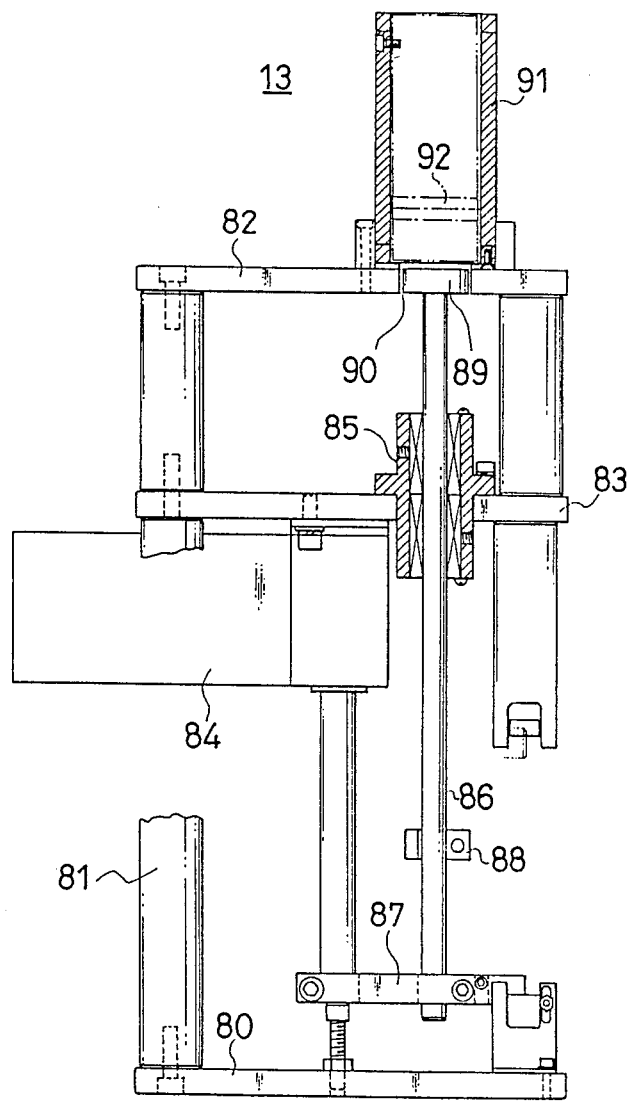
FIG. 10 is a view showing the construction of a tablet containing unit.

The construction of the tablet containing unit 13 will now be described with reference to FIG. 10. A plurality of studs 81 are stood on a base plate 80, and an upper plate 82 is fixedly secured onto the studs 81. A motor fastening plate 83 is disposed above the studs 81, and a linear head motor 84 is mounted on the back surface of the plate 83. The plate 83 has LM balls 85, and a lifting bar 86 is slidably inserted thereinto. The lower end of the bar 86 and the linear head of the motor 84 are coupled by a sensor holder 87. A stopper 88 is mounted at the bar 86. When the stopper 88 makes contact with the lower end of the ball 86, it restricts the lifting end of the bar 86. A lifting plate 89 is secured to the upper end of the bar 86, and projected via a through hole 90 formed at the plate 82 above the plate 82. A tablet holder 91 is mounted on the plate 82 to surround the hole 90, and a number of tablets 92 are stacked therein. The plate 89 acts as the bottom of the holder 91.

Figure 11:
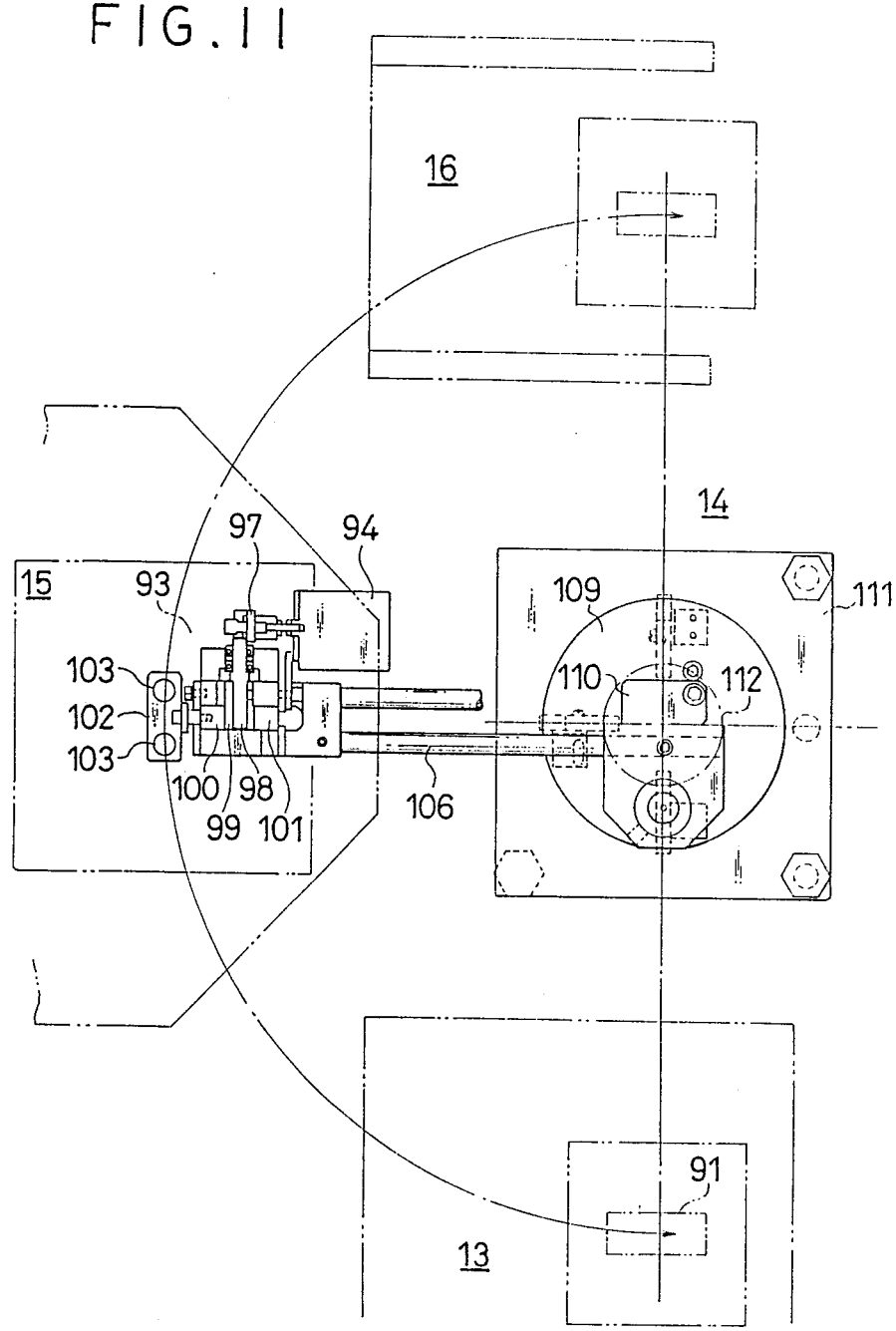
FIG. 11 is a plan view of a tablet supplying unit.
Figure 12:
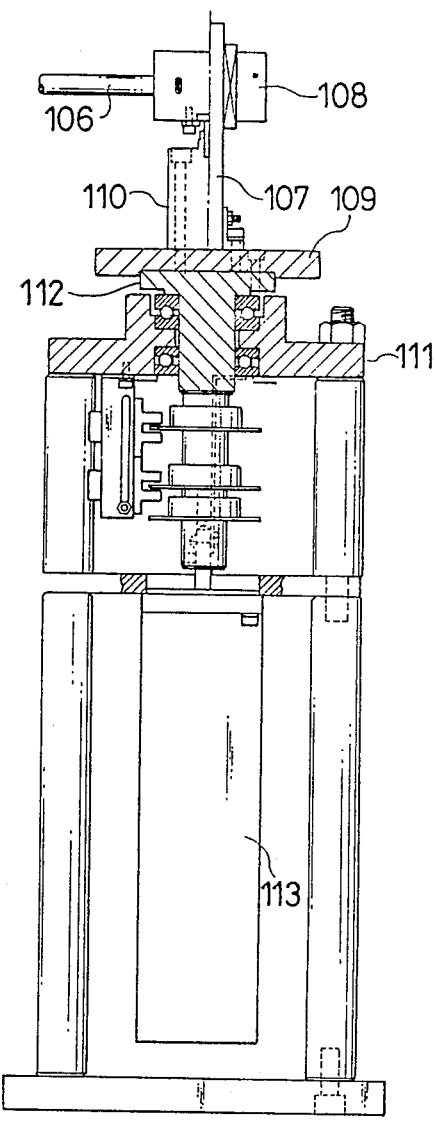
FIG. 12 is a side view of the tablet supplying unit.

Then, referring to FIGS. 11 through 14, the tablet conveying unit 14, i.e., a mechanism for attracting the tablet of the uppermost stage from the tablet holder 91 of the tablet containing unit, feeding the tablet to the preheating unit 15 and further feeding the package molded in a boat shape to the molding heads 16 and 17 will be described in detail. The tablet conveying unit 14 has a head 93 turning clockwise and counterclockwise at 90°. A cylinder 94 is mounted at the head 93, and a knuckle pin 97 engaged with the elliptical opening 96 of a pendulum 96 is mounted at the rod of the cylinder 94. (FIGS. 11 and 14). A pinion gear 99 is provided at the end of a rotational shaft 98 of the pendulum 95, and racks 100 and 101 to be engaged with the gear 99 are disposed at both sides. A pad fastening plate 102 is fixedly secured to the rack, and a pair of vacuum pads 103 are mounted thereon. A presser 105 is mounted through a plate 104 on the other rack 101. The presser 105 is disposed between the pads 103. (FIG. 13) The arm 106 of the head 93 is fixedly secured to a elevation block 108 moving upward or downward along a guide post 107. (FIG. 12) The post 107 is stood at the center of a rotary plate 109. A miniature cylinder 110 for moving upward or downward the block 108 is further mounted on the plate 109. The plate 109 is fixedly secured on a rotational shaft 112 supported by a bearing block 111, and the shaft 112 is rotatably driven by a servo motor 113.

Figure 16:
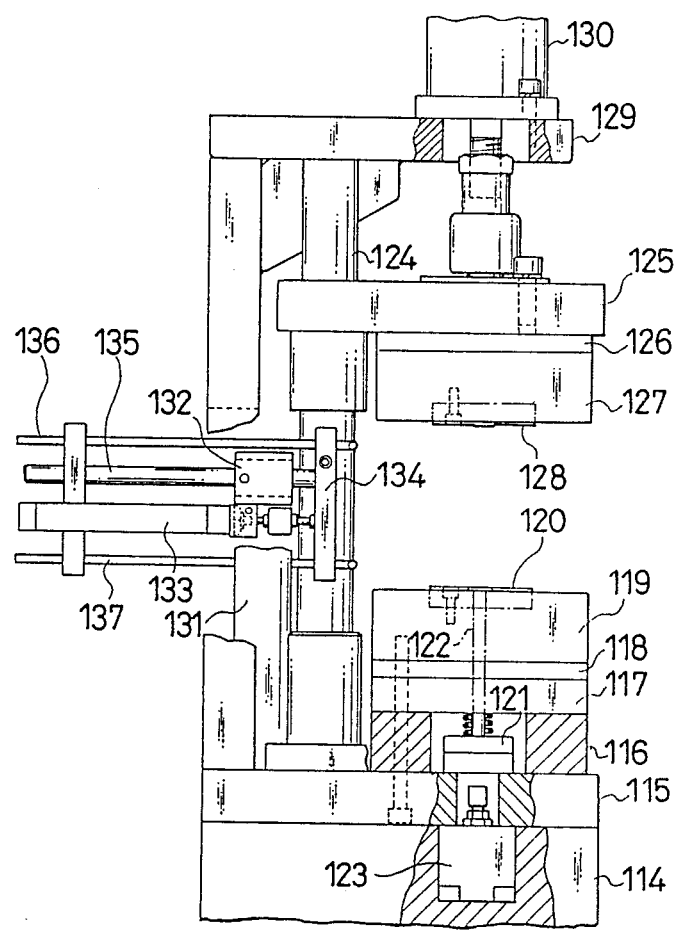
FIG. 16 is a side view of the preheater.

The construction of the preheating unit 15 is, as shown in FIGS. 15 and 16, composed of a fastened lower mold and an upper mold moving upward and downward. The lower mold is composed by laminating a base 115, a gutter block 116, a space liner 117, a heat insulating plate 118 and a heater block 119 in order from the bottom on a gutter block 114. A mold plate 120 formed in a female mold is buried in the upper surface of the block 119. The block 116 is drilled at the center, and a lifting plate 121 is contained therein. The liner 117, the plate 118, the block 119 and an ejector bar 112 passing through the plate 120 are extended above the plate 121. A cylinder 123 is provided to lift the plate 121 from the block 114 to the base 115. The upper mold is mounted on an elevation plate 125 moving upward or downward along two guide shafts 124 stood on the base 115. More particularly, a heater block 127 is mounted through a heat insulating plate at the lower side of the plate 125, and a mold plate 128 formed in a male mole corresponding to the female mold of the plate 120 is buried in the block 127. An upper plate 129 is secured to the upper end of the shaft 124, and a cylinder 130 is mounted thereon. The rod of the cylinder 130 extends downward of the plate 129, and fixedly secured to the plate 125. A hot blower for blowing hot air is mounted on the plates 120 and 128 between the upper mold and the lower mold to improve the molding conditions. More specifically, a LM ball 132 and a cylinder 133 are provided above an angle member 131 secured onto the base 115. A guide bar 135 secured at the end to a conduit supporting plate 134 is slidably inserted into the ball 132. The rod of the cylinder 133 is also secured to the plate 134. L-shaped conduits 136 and 137 are inserted fixedly above and below the plate 135 to flow hot air. A number of air diffusers are opened at the bent ends of the conduits 136 and 137. When the cylinder 133 is moved forward in the construction thus constructed as described above, the plate 135 moves forward while being supported by the guide bar 135 so that the air diffusers of the pipes 136 and 137 oppose the male and female molds of the plates 120 and 128.

Figure 17:
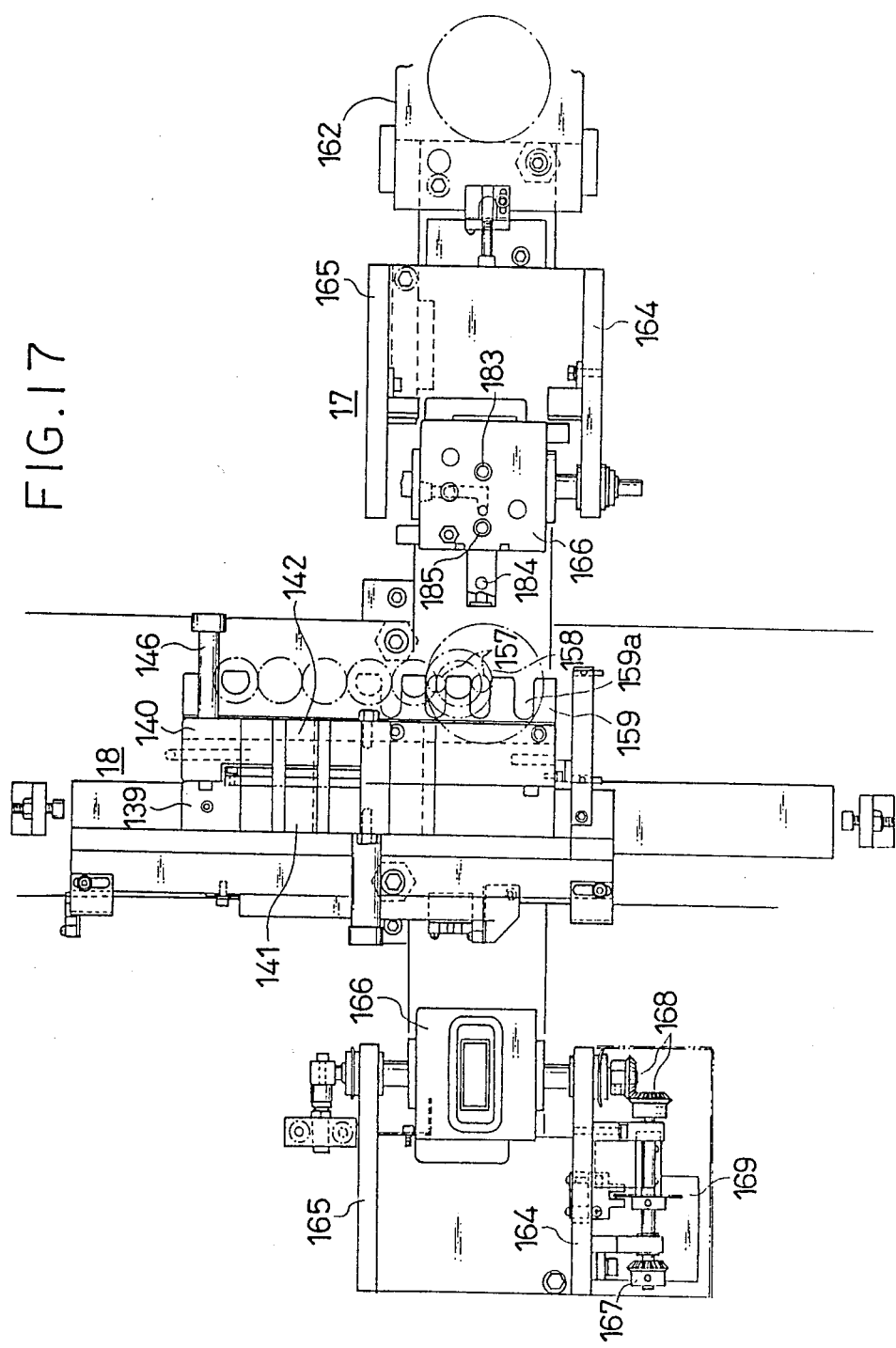
FIG. 17 is a plan view of a mold.
Figure 18:
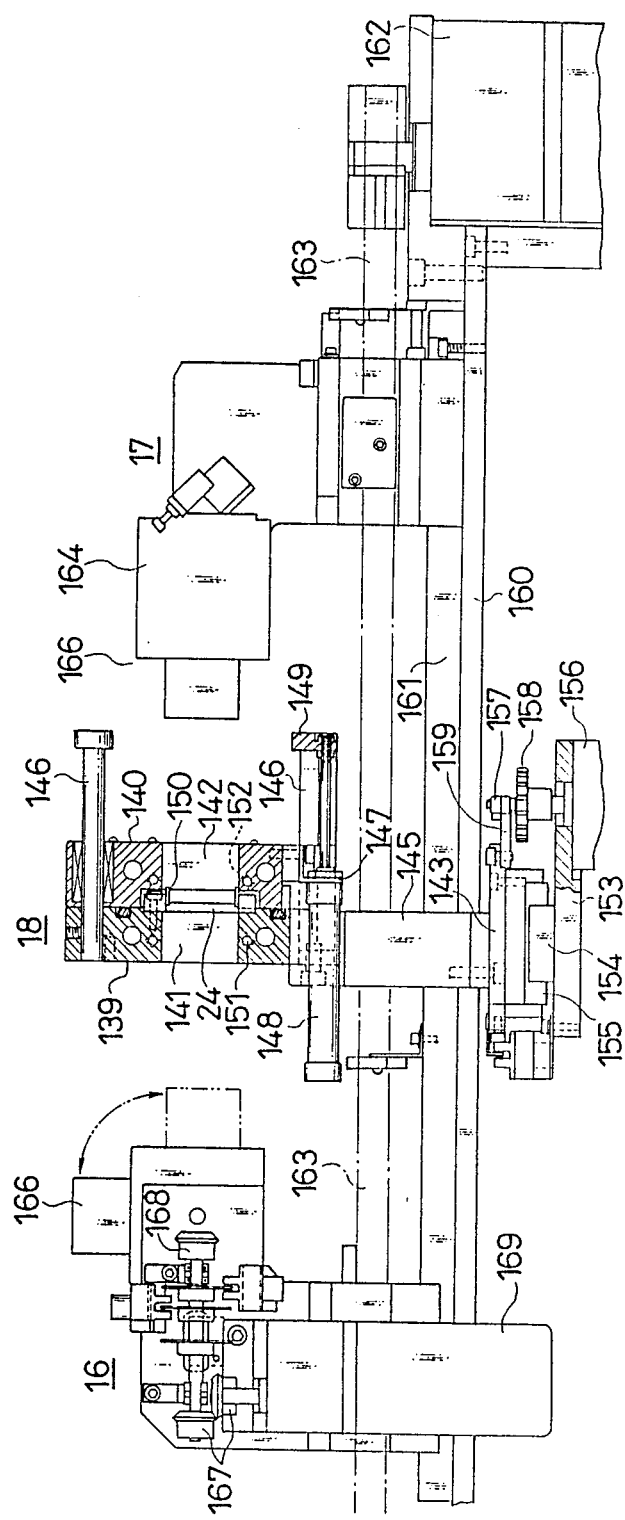
FIG. 18 is a front view of the mold.
Figure 21:
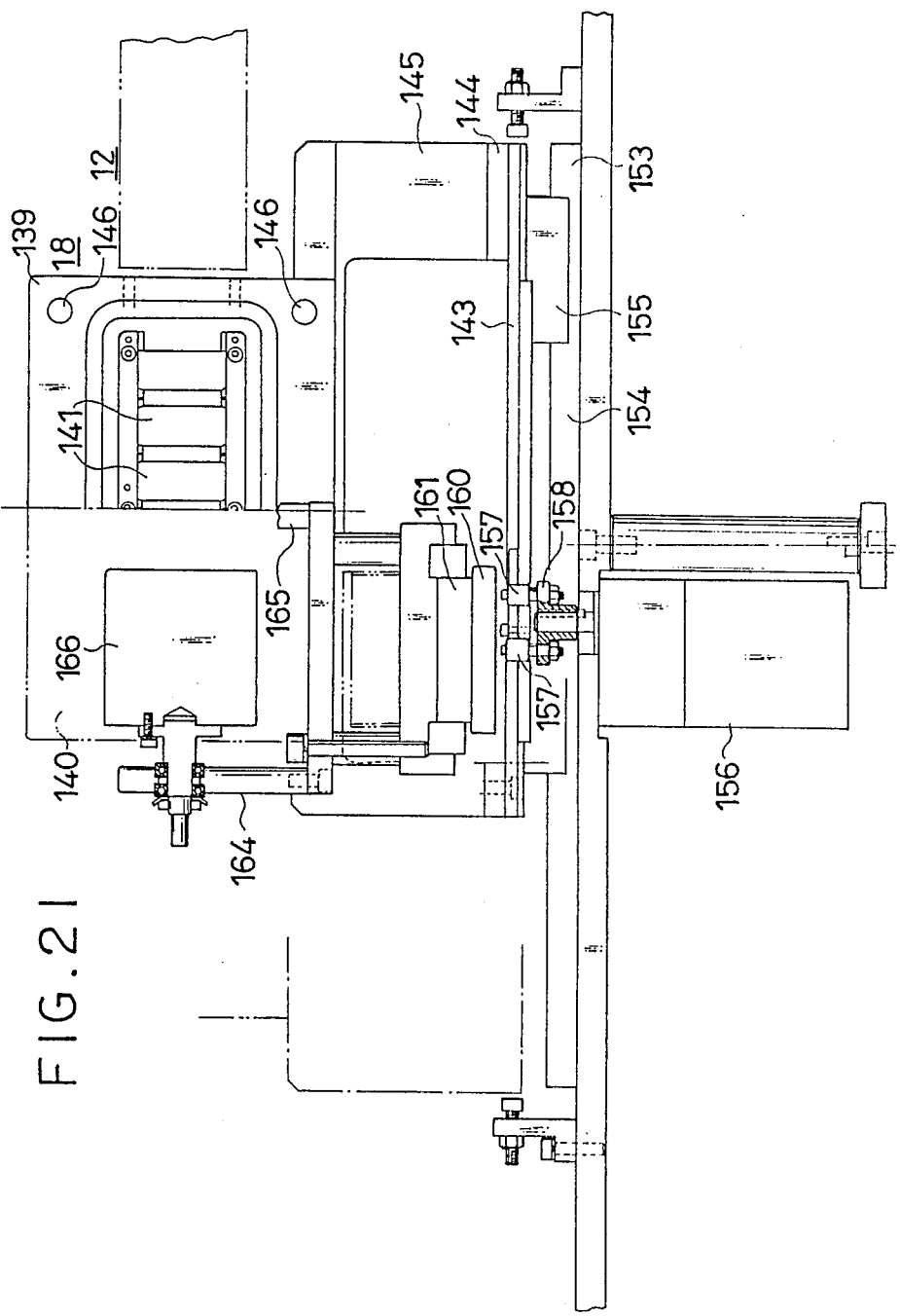
FIG. 21 is a side view of the mold.

The molding unit includes a holding unit 18 for holding the lead frame 24, and the molding heads 16 and 17 disposed at both sides of the holding unit 18. The holding unit 18 has side plates 139 and 140 opening and closing separably in contact by a cylinder 148. Through openings 141 and 142, to which the molding heads 16 and 17 are introduced, are aligned at the center of the side plates 139 and 140. The side plate 139 is secured onto a bridge 145 mounted through a heat insulating plate 144 on a movable base 143. (FIGS. 18 and 21) Guide bars 146 are mounted at four corners of the plate 139. The other plate 140 is slidable with respect to the guide bars 146. The openable cylinder 148 is mounted through a bracket 147 at the lower side of the plate 140, and the ends of the cylinder 148 is secured to a lateral plate 149 bridged between two guide bars 146 of lower side. (FIG. 18) A pin 150 engaged within a pin opening formed at the side of the lead frame 24 for positioning the lead frame 24 is mounted on the upper and lower surfaces of the opening 142 of the plate 140. Hot jet conduits 151 and 152 for injecting hot air toward the frame 24 held by the side plates 139 and 140 are disposed above and below the side plates 139 and 140. The mechanism of the holding unit 18 thus constructed as described above is placed on a movable base 143, and the base 143 moves forward by a cam mechanism to be described in more detail below. A slide guide 155 crossed over a rail 154 laid on the base 153 is secured to the back surface side of the base 143. A cam motor 156 is mounted on the base 153, and a rotary plate 158 having a pair of rollers 157 operating as a function of a cam follower is mounted on the rotational shaft of the motor 156. A cam plate 159 cooperated with the roller 157 is mounted at the end of the base 143. A number of deep grooves 159a to be engaged with the roller 157 are formed at the cam plate 159. (FIG. 17)

The molding heads 16 and 17 are opposed on a rail laid on a base 160 in a slidable state. (FIG. 18) A synchro-belt 163 driven circularly by an electric motor 162 mounted at the end of the base 160 is secured to the heads 16 and 17. The fastening positions of the belt 163 are reverse at the right and left sides at the heads 16 and 17 as seen from the side of the motor 162. A rotary head 166 is rotatably supported between the side plates 164 and 165 of the heads 16 and 17. The head 166 is oppositely rotatably driven at 90° through two sets of miter gears 167 and 168 by an electric motor 169 mounted on the side plate 164 (in the drawings, only the head 3 side is shown, but the head 4 is similarly constructed.) Referring to FIGS. 19 and 20, the internal construction of the head 166 will be described in detail. (in FIGS. 19 and 20, the head 166 is disposed in a horizontal state rotated at 90°.) A recess 166a for containing a package of semi-cured state is formed on the upper surface of the head 166, and two ejector conduits 170 and 171 are slidably buried in the bottom. Vacuum conduits 172 and 173 closed at the upper surfaces are slidably inserted into the conduits 170 and 171, respectively. The conduits 170 and 171 are coupled at the lower portions by an ejector plate 174. The plate 174 is always pressed down by a spring 175, and slightly moves upward against the spring 175 by the pneumatic pressure of the air supplied from an air supplying port 176. A spring 177 extended from the conduits 170 and 171 and mounted at the lower ends is provided below the conduits 172 and 173, and coupled by an ejector plate 178. The plate 178 is always pressed by the spring 177, and rises by supplying air from an air supplying port 179. A peripheral slot 180 is formed on the inner upper surfaces (in the left side of FIG. 19) of the conduits 170 and 171. (FIG. 20) An air flow inlet 181 is formed through the tubular walls above the conduits 172 and 173. The inlet 181 communicates with the exterior by disposing the upper ends of the conduits 172 and 173 downward to the position of the slot 180 (communicating in FIG. 20). An air flow outlet 182 is formed at the extended portions of the conduits 170 and 171 below the conduits 172 and 173. The outlet 182 communicates with an air bleed passage 183 connected to a vacuum pump. An air flow passage 184 is provided above the head 166, and communicates with an air bleed passage 185 connected to a vacuum pump.

The construction of the molding unit as described above is provided to mold semiconductor device one by one, but may be composed to simultaneously mold a plurality of semiconductor devices by aligning a plurality of recesses 166a.

The mechanisms of the unloader 19 and the lead frame containing unit 20 are substantially similarly constructed as those of the loader 12 and the lead frame supplying unit 11.

As shown in FIG. 2, dispensers 186 for coating the opposed surfaces of the packages with a bonding agent may be disposed at both sides of the unloader 19. The construction of the dispenser 186 is shown in FIGS. 22 and 23. The dispenser 186 has two linear head motors 187 and 188, which are disposed so that the operating directions perpendicularly cross. The motor 188 is mounted on a base 189 driven reciprocatingly by the motor 187. Then, a nozzle 190 for coating the four sides of the packages with a bonding agent is mounted at the end of the head of the motor 188. The nozzle 190 is moved upward and downward by a cylinder 190. The construction thus constructed as above is secured through a fastening plate 192 further to the body of a third linear head motor 193. The motor 193 is mounted by fastening the head to an upper plate 195 provided on posts 194.

The operation of the apparatus of the invention constructed as described above will now be described. Entire sequence of the operation will be first described by referring to FIGS. 2 and 3. One lead frame 24 is fed in the laterally stood state from the lead frame supplying unit 11. The frame 24 thus fed is further fed through the loader 12 to the holding unit 18. In the meantime, the tablet conveying unit 14 is operated to attract and raise the tablet from the tablet containing unit 13, turn the tablet at 90° and convey the tablet onto the preheating unit 15. There, the tablet is heated to become packages molded in boat shape. Subsequently, the tablet conveying unit 14 again attracts the packages, further turns the packages at 90°, and conveys the packages to the molding heads 16 and 17. After a fusible bonding agent is coated, as required, on the opposed surfaces of the packages, the pair of heads 16 and 17 turn at 90° in the package attracting state, hold and oppose the holding unit 18 and move to approach each other. Thus, the heads interpose the lead frame 24 from both sides to bond the packages so as to seal the semiconductor device and the like. After finishing the sealing of the semiconductor device, the heads 16 and 17 separate to move backward in the opposite directions. Simultaneously, the frame 24 is moved forward at a pitch, the steps are then repeated to seal the second semiconductor device from the front side. Similarly, when the entire semiconductor devices are completely sealed, the lead frame 24 is conveyed by the unloader 19, and contained in a vacant magazine.

Then, the operations of the respective units will now be described. In the lead frame supplying unit 11 shown in FIGS. 4 and 5, a magazine 23 in which a number of lead frames 24 are contained in the laterally stood state, is set on the base 22. At this time, the pin handle 41 is operated to press the magazine 23 by the roller 40 to press the corners of the magazine by the lock roller 39. When the cylinder 35 becomes the nonoperating state, the pusher 36 is pulled by the spring 38, moved forward along the guide rail 37, introduced into the magazine 23 and pressed out the lead frame 34 of the outermost side to a predetermined position, i.e., to the position where the end is moved to the pulleys 50 and 54 of the foremost side of the loader 12. There, when the cylinder 67 of the loader 12 is moved backward and releases pressing to the rotary plate 65, the plate 65 is pulled and rotated by the spring 66, and the driven rollers 64 hold the end of the lead frame 24 between the inside pulleys 50 and 54. (FIG. 9) When the motors 48 and 49 start in this state, The frame 34 is conveyed first by the pulleys 50 and 54 and the rollers 64 for them, and fed at the end to between the pulleys 51 and 55 and the driven rollers 65 for them. At this time, since the pulleys 51 and 55 and the rollers 64 for them are rotatably driven by the motor 49, the frame 24 is moved forward smoothly to therebetween. The frame 24 is further moved forward to the pulleys 58 and 59, but since the pulleys 58 and 59 and the rollers 64 therefor are also rotatably driven through the belts 56 and 57, the frame 24 is further fed forward, and introduced into the lead frame guide of the holding unit 18. The frame 24 is moved forward until the frame 24 passes the pulleys 58 and 59. When the frame 24 is arrived thereat, the cylinder 69 is operated to attract the pusher plate 75, and disposed behind the frame 24. Subsequently, when the cylinder 74 operates to telescope forward, the frame 24 is pressed by the pusher plate 75, and stopped at the home position of the holding unit 18. When the frame 24 of the outermost side is completely pushed out of the magazine 23 by the operation of the loader 12 as described above, the motor 31 starts to rotate the shaft 27 at a predetermined angle, as returning to FIGS. 4 and 5. Then, the base 22 moves through the block 26 engaged with the shaft 27 at a pitch in the axial direction of the shaft 27 at an interval of the frame in the magazine 23. Thus, the second frame from the outermost side is arrived at the passing line of the pusher 36, and the frame is pushed from the magazine 23 by the operation similarly as described above.

Then, the operations of the tablet containing unit 13 (FIG. 10) and the tablet conveying unit 14 (FIGS. 11 to 14) will now be described. In the tablet containing unit 13, when the linear head motor 84 starts from the state shown in FIG. 10, the bar 86 lifts through the holder 87 to lift the tablet 92 laminated on the plate 89 at a pitch, i.e., at the distance corresponding to the thickness of a tablet out of the tablet holder 91. The vacuum pads 103 stand by on the tablet 92, and when the tablet group lift at a pitch, the miniature cylinder 100 shown in FIG. 12 operates to move down the block 108. Then, the head 93 also moves down through the arm 106, but the rack 101 is set in the moving down state at that time, and the presser 105 is disposed below the pads 103 through the plate 104. (in the state shown in FIGS. 13 and 14) Accordingly, when the head 93 moves down, the presser 105 first makes contact with the tablet 92 to press the tablet. When the cylinder 94 is operated to telescope forward from this state, the knuckle pin 97 moves along the elliptical opening 96, the pendulum 95 pivotally rotates at the shaft 98 as a fulcrum, and the gear 99 rotates. Thus, the rack 101 lifts, and the rack 100 moves down. As a result, the presser 105 lifts separately from the tablet 92, and the pads 103 reversely move down to make contact with the tablet 92 so as to attract the tablet 92. Then, the cylinder 110 is operated to telescope upward. Thus, only the tablet 92 of the uppermost side is attracted and floated. Subsequently, the servo motor 113 starts to rotate the plate 109 at 90°. Then, the head 93 turns at 90° to move from the tablet containing unit 13 onto the preheating unit 15, and stops on the mold plate 120. (FIG. 11) Then, the head again moves down and releases the attracted tablet 92. Thereafter, the tablet 92 is contained in the female mold of the plate 120. The head 93 immediately moves upward to turn and to separate from the preheating unit 15. Then, in FIG. 16, the cylinder 130 is operated to move down the mold plate 128 through the elevation plate 125, the heat insulating plate 126 and the block 127, thereby bonding the mold plate 128 to the mold plate 120 of the lower mold. Consequently, the tablet 92 is heated and molded in packages of semicured state. The packages are separated from the molds when the upper mold is lifted by the operation of the cylinder 130, and the lifting plate 121 and the ejector bar 122 secured thereto lift by the operation of the cylinder 123. After the packages are molded completely, the head 93 is again moved in this manner, the boat is attracted by the pads 103, turned at 90°, and the packages are dropped to the recess 166a of the heads 16 and 17. Then, the head 93 is again turned onto the tablet containing unit 13, and the operation described above is then repeated. In the preheating unit 15, the cylinder 133 is operated to telescope forward whenever the packages are molded, directed at the air diffusers of the conduits 136 and 137 toward the male and female molds of the mold plates 120 and 128 and hot air is injected. Thus, the molds are cleaned, and heated, thereby improving the molding conditions.

When the frame 24 is fed from the loader 12 to the holding unit 18, the side plate 140 is separated from the side plate 139. More specifically, when the cylinder 148 is telescoped backward, since the end of the rod is fastened to the lateral plate 149 between the guide bars 146, the cylinder 148 itself moves toward the plate 149. (rightward in FIG. 18) Thus, the side plate 140 to which the cylinder 148 is secured through the bracket 147 moves together and separates from the side plate 139. When the frame 24 is pressed to the home position in this state, the cylinder 148 is operated to telescope forward, and the side plate 140 is contacted with the side plate 139. At this time, the pin 150 is introduced into the pin opening of the side edge of the frame, thereby positioning the frame 24. Thus, when the frame 24 is set to the home position, hot air of approx. 180° near the molding temperature of the tablet is ejected from the upper and lower hot jet conduits 151 and 152 toward the frame 24, thereby heating the frame 24.

A fusion bonding agent is coated by a dispenser 186, as required, in the upward state (the state of the head 15 in FIG. 18) on the packages contained in the recesses 166a of the heads 16 and 17. More specifically, in FIG. 23, when the motor 193 is first operated, since the head is secured, the body moves, and the nozzle 190 is disposed at one corner of the package attracted into the recess 166a of the head 166. Then, the cylinder 191 is operated to move down the nozzle 190, and the motors 187 and 188 alternatively operate while dropping the bonding agent from the nozzle 190. Thus, the nozzle 190 draws the locus of the square shape to coat the four sides of the package with the bonding agent. Then, after the nozzle 190 is lifted by the operation of the cylinder 191, the motor 193 operates reversely to move backward the nozzle 190.

When the packages are contained in the recesses 166a, no air is supplied from the port 176, and the ejector plate 174 is pressed down by the spring 175. As a result, the upper ends of the conduits 170 and 171 coincide with the bottoms of the recesses 166a. On the other hand, no air is as well supplied from the port 179, and the plate 178 is pressed down by the spring 177. As a result, the upper ends of the conduits 172 and 173 are moved down into the peripheral slots 180 to communicate with the upper ends of the conduits 170, 171, the slot 180, the inlet 181, the interiors of the conduits 172 and 173, the outlet 182 and the passage 183. Thus, when the air is bled from the passage 183, the packages are attracted, and effectively attracted into the recesses 166a. When the motor 169 starts in this state, the head 166 rotates at 90° through two sets of miter gears 167 and 168, and opposes through the holding unit 18. The packages become vertical state at this time, but since thus attracted, the packages do not drop. Subsequently, when the motor 162 is started and the synchro-belt 163 is circulated, the heads 16 and 17 secured thereto moves to approach each other, and the head 166 is engaged within the openings 141 and 142 of the side plates 139 and 140, respectively. Then, the chip of the frame 24 is interposed from both sides by the packages, the packages are thus bonded to complete the packaging. The packages are bonded by adhesive bonding and/or fusion-bonding. When the head 166 is introduced into the openings 141 and 142, the air therein is urged, but since a slight gap is formed between the side walls of the openings 141 and 142 and the peripheral surface of the head 166, the compressed air is bled from the passage 184 into the passage 185. Thus, the periphery of the chip is evacuated in vacuum, thereby preventing air bubbles form generating in case of packaging. After the packages are bonded, when the air is supplied from the port 179, the plate 178 is lifted against the spring 177 to lift the conduits 172 and 173. As a result, the slot 180 is blocked, thereby releasing the attraction of the packages. Then, when air is also supplied from the port 176 and the plate 174 is lifted against the spring 175, the conduits 170 and 171 are thus projected at the upper ends into the recesses 166a, thereby releasing the packages. When the motor 162 is then rotated reversely, the head 166 is exhausted from the openings 141 and 142, moved backward to the initial position by the reverse operation to the above described operation, and inverted at 90° to be directed upward to stand by for the next packages. In the meantime, in the holding unit 18, the cam motor 156 is started to rotate the plate 158. Then, the pair of rollers 157 mounted on the plate 158 move in a circular motion at 180°. Since the rollers 157 are engaged with the deep grooves 159a of the cam plate, the rollers slide while rotating around their own axis in the groove 159a in case of circular motion. Consequently, the cam plate 159 is moved forward at a pitch, i.e., at a distance corresponding to the interval of the grooves 159a. The interval of the grooves 159a is equal to that of the chips of the frame 24. When the plate 159 thus moves, the holding unit 18 secured thereon moves integrally as supported to the slide guide 155 crossed over the rail 154. Thus, the second chip of the frame 24 is disposed at the packaging line by the heads 16 and 17. Subsequently, whenever the plate 158 rotates at 180°, the holding unit 18 moves forward at a pitch. The packaging is conducted by the operations of the heads 16 and 17 at every pitch. Thus, when the packaging of the all devices is finished, the frame 24 is pulled and conveyed by the unloader 19 adjacent to the holding unit 18, and contained in the magazine in the lead frame containing unit 20.

The abovementioned operation is sequentially and continuously performed in the present invention.

According to the present invention as described above, the packaging work of the semiconductor device and the like can be automatically and efficiently performed in one line without necessity of large-scale mold, and can advantageously perform a multiple type and small quantity production.

What is claimed is:

1. A process for packaging a semiconductor device comprising the steps of:
   providing a tablet of curable resin,
   weighing the tablet for upper and lower packages,
   preheating the upper and lower packages,
   compression molding the packages in a package shape,
   coating the opposed surfaces to be bonded of the upper and lower packages with a fusible bonding agent,
   interposing a chip of a semiconductor device between the upper package and the lower package,
   heating the upper and lower packages while supplying nitrogen gas in a vacuum molding machine,
   bonding the upper and lower packages, and
   conducting an antioxidation of a metal portion.

2. A process according to claim 1 wherein said curable resin is an epoxy resin.

3. A process according to claim 1 wherein said fusible bonding agent is a thermoplastic resin.

4. An apparatus for packaging a semiconductor device and the like comprising:
   a lead frame supplying unit for pushing out lead frames aligned longitudinally and contained in a magazine one by one into a loader,
   loader for conveying the lead frame into a molding unit,
   a molding unit connected with the loader and having a molding head for attracting a supplied tablet, turning the tablet at 90° oppositely, and approaching from both sides of the lead frame to package the tablet,
   a pair of right and left tablet containing units for laminating, containing a number of tablets of curable resin in the amount corresponding to one molding, lifting and supplying the tablets,
   a tablet supplying unit for attracting the tablet from the tablet containing unit and supplying the tablet to the molding head of the molding unit, and
   an unloader for recovering the packaged lead frame into the magazine.

5. The apparatus for packaging a semiconductor device and the like as defined in claim 4, wherein a dispenser for coating a fusible bonding agent on the bonding surfaces of the package is disposed at each side of said unloader.

6. The apparatus for packaging a semiconductor device as defined in claim 4, wherein said molding unit comprises means to simultaneously mold a plurality of semiconductor devices.

7. The apparatus for packaging a semiconductor device and the like as defined in claim 4, wherein a preheater is disposed between said tablet containing units and said molding unit to preheat the tablet before supplying the tablet to said molding unit.

8. The apparatus for packaging a semiconductor device and the like as defined in claim 7, wherein said preheater comprises a compression molding means together with preheating means.

9. An apparatus for packaging a semiconductor device, comprising:
   means for providing a tablet of curable resin,
   means for weighing the tablet for upper and lower packages,
   means for preheating the upper and lower packages,
   means for compression molding the packages in a package shape,
   means for coating the opposed surfaces to be bonded of the upper and lower packages with a fusible bonding agent,
   means for interposing a chip of a semiconductor device between the upper package and the lower package,
   means for heating the upper and lower packages while supplying nitrogen gas in a vacuum molding machine,
   means for bonding the upper and lower packages, and
   means for conducting an anti-oxidation of a metal portion.

* * * * *